United States Patent
Chaudhari

(12) 
(10) Patent No.: US 6,822,474 B2
(45) Date of Patent: Nov. 23, 2004

(54) ON CHIP LOGIC ANALYZER DEBUG BUS

(75) Inventor: Sunil Chaudhari, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 10/334,311

(22) Filed: Dec. 31, 2002

(65) Prior Publication Data

US 2004/0124903 A1 Jul. 1, 2004

(51) Int. Cl.⁷ .................. H03K 19/00; H03K 19/173
(52) U.S. Cl. ................... 326/16; 326/47; 714/724
(58) Field of Search ............... 326/16, 37–39, 326/41, 47, 101; 714/724–727

(56) References Cited

U.S. PATENT DOCUMENTS 5,510,742 A  *  4/1996  Lemaire ................ 327/146
5,550,843 A  *  8/1996  Yee ..................... 714/726
6,157,210 A  * 12/2000  Zaveri et al. ............ 326/40

* cited by examiner

Primary Examiner—James H. Cho
(74) Attorney, Agent, or Firm—Buckley, Maschoff & Talwalkar LLC

(57) ABSTRACT

A method, apparatus, and system for determining or observing internal state information in a chip.

21 Claims, 6 Drawing Sheets

ON CHIP LOGIC ANALYZER DEBUG BUS

BACKGROUND

As higher and higher levels of circuit integration are achieved on a single chip, the complexity of the chip may increase significantly. As a result, difficulty in determining or observing internal operation of the chip or internal state information of the chip also may increase significantly. Thus, there may be a need for a system, apparatus, and method by which internal state information of a chip can be monitored and observed.

BRIEF DESCRIPTION OF THE DRAWINGS

The subject matter regarded as embodiments of the invention is particularly pointed out and distinctly claimed in the concluding portion of the specification. Embodiments of the invention, however, both as to organization and method of operation, together with objects, features, and advantages thereof, may best be understood by reference to the following detailed description wherein like reference numerals are employed to designate like parts or steps, when read with the accompanying drawings in which:

DETAILED DESCRIPTION OF THE INVENTION

Figure 1:
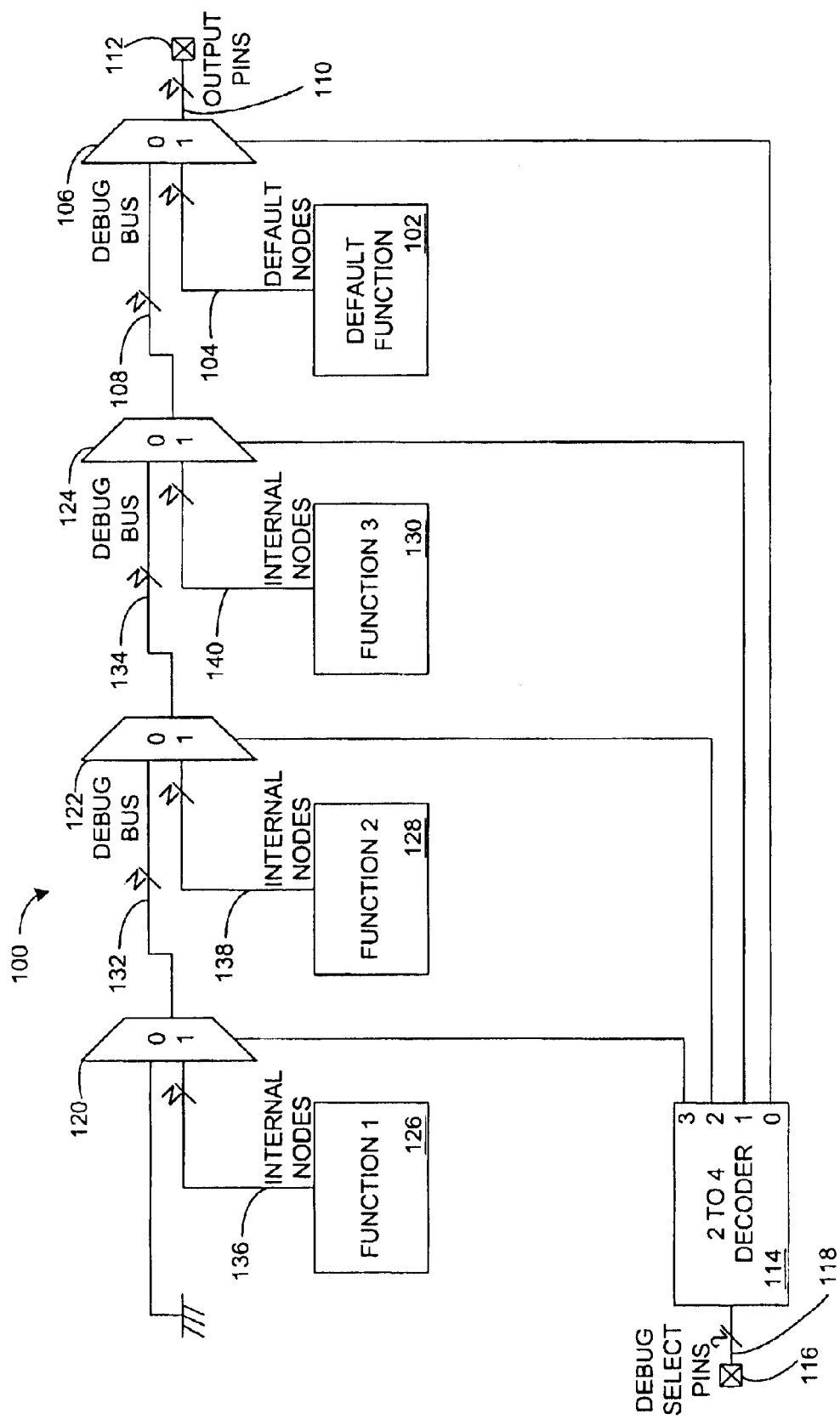
FIG. 1 is a block diagram of an apparatus suitable for practicing an embodiment of the invention.

Reference will now be made in detail to the preferred embodiments of the present invention, examples of which are illustrated in the accompanying drawings. It is to be understood that the Figures and descriptions of embodiments of the present invention included herein illustrate and describe elements that are of particular relevance, while eliminating, for purposes of clarity, other elements found in typical computers and computer networks. Other details, features, and advantages of the present invention will become further apparent in the following detailed description of the embodiments.

Any reference in the specification to "one embodiment," "a certain embodiment," or a similar reference to an embodiment is intended to indicate that a particular feature, structure or characteristic described in connection with the embodiment is included in at least one embodiment of the invention. The appearances of such terms in various places in the specification are not necessarily all referring to the same embodiment.

In the present embodiment, the term "chip" may include, but is not limited to, any substrate, die, or group of substrates packaged together, on or in which active and/or passive circuit elements are scribed, fabricated, etched, or located; any semiconductor or other material on or in which one or more electronic components or circuits are scribed, fabricated, etched or otherwise formed; an integrated circuit or group of circuits or electronic components; etc.

In the present embodiment, the term "bus" may include, but is not limited to, any communications path, connector, or land between one or more pins or other points in a chip; any group of wires or lands that can be used to transmit or convey power, signals, data, information, etc. within a chip and/or which can be used to transmit digital information from one or more sources to one or more destinations; any mechanical, logical, or electrical interconnection scheme for circuits and other elements in a chip; and any common path for data, address, and/or control information between circuits and other elements in a chip.

In the present embodiment, the term "pin" may include, but is not limited to, any terminal, jack, receptacle, prong, connector, node, input tab, land, output tab, etc, on or in a chip. A pin may be completely internal to a chip or provide an external connection point for or to the chip.

In the present embodiment, the term "switch" may include, but is not limited to, a mechanical and/or electrical device or electronic circuitry that completes or breaks the path of current, voltage, power, or other signal or sends such signal over a different path; a mechanical and/or electrical device or electronic circuitry that connects, disconnects, or transfers one or more circuits, buses, signals, etc.; a mechanical and/or electrical device or electronic circuitry located in or forming part of a chip and designed for making, breaking, interrupting, completing, or changing connections in or between electrical circuits or electronic components in the chip; a multiplexer; an electrical device or electronic circuitry (which may be located in or form part of a chip) that can select one of a number of input signals or input buses and switching information provided on or by the input signals or input buses to an output signal or bus; an electrical device or electronic circuitry (which may be located in or be part of a chip) that can select one of a number of input s or input buses and connecting the selected input or input bus to an output or output bus; a digital device that can select one of a number of inputs or input buses and pass the logic level(s) of the selected input or input bus to an output or output bus; and an electrical device or electronic circuitry (which may be located in or be part of a chip) that can interleave or transmit data, information, or signals, from different buses or other sources over a common bus or other communications channel.

In the present embodiment, the term "decoder" may include, but is not limited to, an electrical device or electronic circuitry (which may be included in or form part of a chip) that may accept an input and activate one or more specific outputs in one or more designated ways depending on the input.

Referring now to FIG. 1, an apparatus 100 indicative of a first embodiment of the present invention is illustrated. The apparatus 100 may be part of a chip and allow or provide observation of internal operation, nodes, etc. of the chip without changing the behavior of the chip. The chip may be included on a board with one or more additional components, devices, circuits, etc. The apparatus 100 may be controlled by primary inputs to the chip or controller as part of the board with pull-up or pull-down resistors or other components.

The apparatus 100 may include default functional circuitry or block 102 coupled via an N-bit bus 104 to a switch 106. The switch 106 operates to connect either the bus 104 or a bus 108 to an N-bit output bus 110. The output bus 110 may be connected directly or indirectly to output pins 112, some or all of which are externally accessible from the chip. The output pins 112 may be connected directly or indirectly to a test device (e.g., a logic analyzer, oscilloscope, probe, measurement device), data storage device, or other device or component.

Operation of the switch 106 and connection of either the bus 104 or the bus 108 to the output bus 110 may be controlled by a decoder 114 that is connected directly or indirectly to select pins 116 via an M-bit bus 118. In general, the number of select pins 116 is equal to the ceiling of the log base 2 of the number of functional circuit blocks. The select pins 116 may be connected directly or indirectly to one or more dip switches, input sources (e.g., voltage or logic signal sources), pattern generators, or other devices in order to control the decoder 114.

Some or all of the select pins may be externally accessible from a chip that includes the apparatus 100. For purposes of the apparatus illustrated in FIG. 1, M is equal to two for the bus 118. During normal operation of the apparatus 100, signals produced by the default functional block 102 are provided to the output bus 110 of the switch 106 by the switch 106.

In addition to the switch 106, the apparatus 100 includes switches 120, 122, and 124 and functional circuitry or blocks 126, 128, 130. The output of the switch 120 on N-bit bus 132 is an input to the switch 122. Likewise, the output from the switch 122 on N-bit bus 134 is an input to the switch 124 and the output from the switch 124 on the bus 108 s an input to the switch 106. Functional block 126 produces an input to the switch 120 on an N-bit bus 136. Functional block 128 produces an input to the switch 122 on an N-bit bus 138. Functional block 130 produces an input to the switch 124 on an N-bit bus 140. A functional block may represent a set of internal nodes, outputs, signals, or representative data from internal points in a chip that includes the apparatus 100.

In some embodiments, a functional block might not produce N signals or outputs for input into a switch. Thus, some of the N-bits input to the switch may be tied to ground, a specific voltage reference, or other signal, node, etc.

The operation or position of the switches 120, 122, 124 are controlled or otherwise configured by the decoder 114 in a manner similar to the switch 106. By configuring the operation or positions of the switches 106, 120, 122, 124, the decoder 114 can control which signals produced by the circuitry 102, 126, 128, 130 are provided on the output bus 110. For example, the decoder 114 may control the control the switch 120 so that the signals on the bus 136 are provided on the bus 132, the switch 122 so that the signals on the bus 132 are provided on the bus 134, the switch 124 so that the signals on the bus 134 are provided on the bus 108, and the switch 106 so that the signals on the bus 108 are provided on the bus 110. Thus, the signals produced by the circuitry 126 are provided on the output bus 110. By controlling the switches 106, 122, 122, 124, the decoder 114 can control which signals from which of the circuitry 102, 126, 128, 130 or ground signals are provided on the bus 110.

The signals from the circuitry 126, 128, 130, 102 may represent internal operation, nodes, states or signals on a chip that includes the apparatus 100, thereby allowing the apparatus 100 to provide access to such internal operation, nodes, states or signals on the chip when debugging of the chip is desired access to such internal information is desired. One or more repeaters may be used or inserted in a bus to maintain signal integrity on the bus. The buses between switches may be positioned on a chip so that output(s) from different functional circuitry or functional blocks can be connected to the bus or otherwise inserted. In some embodiments, the signals or outputs produced by different functional blocks may be operating at different frequencies or at one more frequencies different than the signals or outputs produced by default circuitry that represents normal operation of a chip.

While only three additional functional blocks 126, 128, 130 are illustrated in addition to the default functional block 102 in the apparatus 100, in other embodiments additional functional blocks may be used in conjunction with corresponding switches.

As one alternative to the apparatus 100, the bus 136 may be connected to the switch 122 as a replacement for the bus 132. In this embodiment, the switch 120 becomes unnecessary and the buses 136, 138 are the input buses for the switch 122. In other embodiments, other configurations of switches may be used. The serial switch and bus design for the apparatus 100 as illustrated by the switches 106, 120, 122, 124 and the buses 104, 108, 132, 134, 136, 138, 140 may require a reduced amount of physical resources than other configurations and/or shorter routes between functional blocks and switches. In other embodiments, different design criteria may allow for other configurations.

Figure 2:
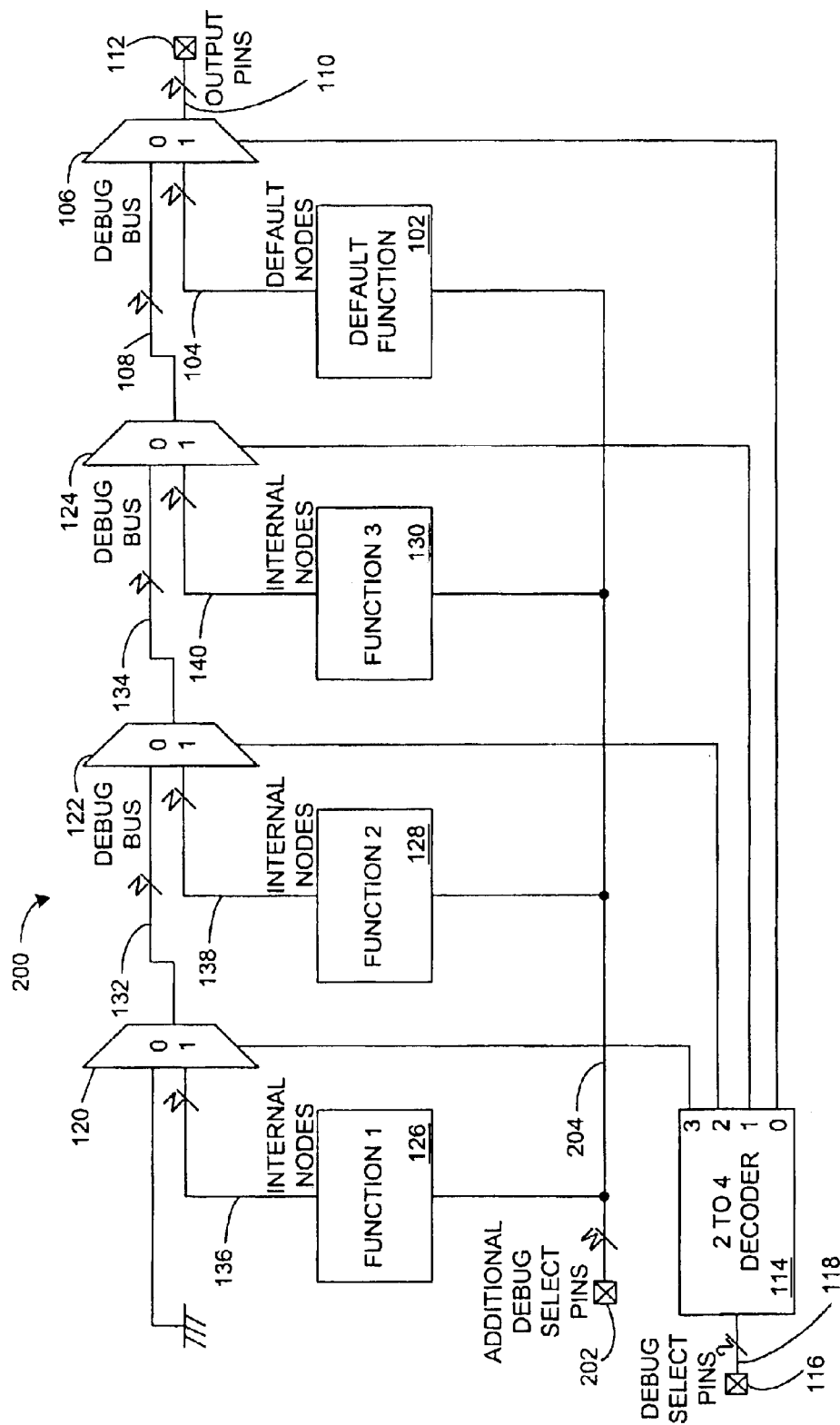
FIG. 2 is a block diagram of another apparatus suitable for practicing an embodiment of the invention.

Now referring to FIG. 2, an apparatus 200 indicative of a second embodiment of the present invention is illustrated. The apparatus 200 may be part of a chip. The chip may be included on a board with one or more additional components, devices, circuits, etc. Like the apparatus 100, the apparatus 200 may be controlled by primary inputs to the chip or controller as part of the board with pull-up or pull-down resistors or other components or circuitry.

The apparatus 200 includes all of the components of the apparatus 100 previously discussed above. In addition, the apparatus 200 includes additional debug select pins 202 tied or connected to the functional blocks 126, 128, 130, 102 via M-bit bus 204. In different embodiments of the apparatus, M may be less than, equal to, or greater than N. In some embodiments, the select pins 202 may be tied to the bus 204 via a decoder or some other component. The select pins 202 may be connected to one or more dip switches, input sources (e.g., voltage or logic signal sources), or other devices in order to control the signals on the bus 204 or any decoder connected to the select pins 202. The bus 204 provides signals to the functional blocks 102, 126, 128, 130.

In some embodiments, the select pins 202 may be used to reduce the width or size of the N-bit buses 104, 108, 118, 132, 134, 136, 138, and/or 140. For example, each of the functional blocks 102, 126, 128, 138 may include one or more internal multiplexers, switches or other circuitry that compresses or otherwise reduces the number of outputs from the functional block. For example, now referring to FIG. 3, if the number of internal nodes to bring out, or at least available to bring out, from each of the functional blocks 102, 126, 128, 130 is thirty-two, but N is equal to eight, then two additional debug select pins 202 can be connected via the 2-bit bus 204 to each of the functional blocks 102, 126, 128, 130 to select any one of the four groups of eight internal nodes for output from the functional blocks 102, 126, 128, 130 on the buses 104, 136, 138, 140, respectively, via one or more switches or multiplexers in the functional blocks 102, 126, 128, 130. Thus, the bus 204 controls the output of the functional blocks and acts as a control signal for the functional blocks 102, 126, 128, 130. In addition, as the bus 204 is connected directly or indirectly to the select pins 202, the select pins 202 also are adapted or able, via the bus 204, to control output of the functional blocks 102, 126, 128, 130 on the buses 104, 136, 138, 140, respectively, particularly since the select pins 202 are externally accessible.

Figure 3:
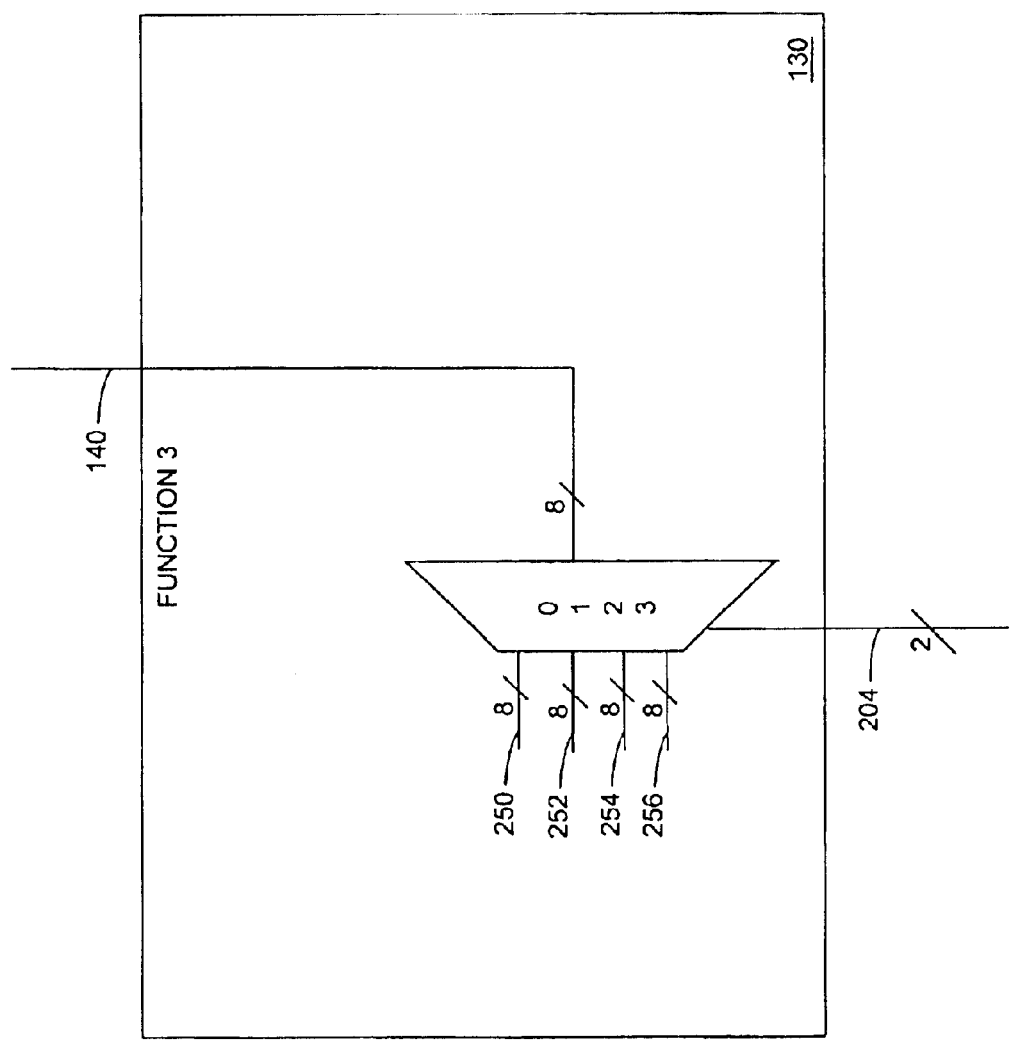
FIG. 3 is a block diagram of one of the function blocks of FIGS. 1 and 2.

As illustrated in FIG. 3, the functional block 130 has an two bit input bus 204 for selecting from among four 8-bit input buses 250, 252, 254, 256 (or signals from thirty-two input nodes) for output on the 8-bit output bus 140. Some or all of the other functional blocks 102, 126, 128 may be similarly configured for control by the bus 204. Alternatively, a programmable internal register on a chip containing the apparatus 200 might be implemented to select the internal nodes of the functional blocks 102, 126, 128, 130 on the buses 104, 136, 138, 140, respectively.

Figure 4:
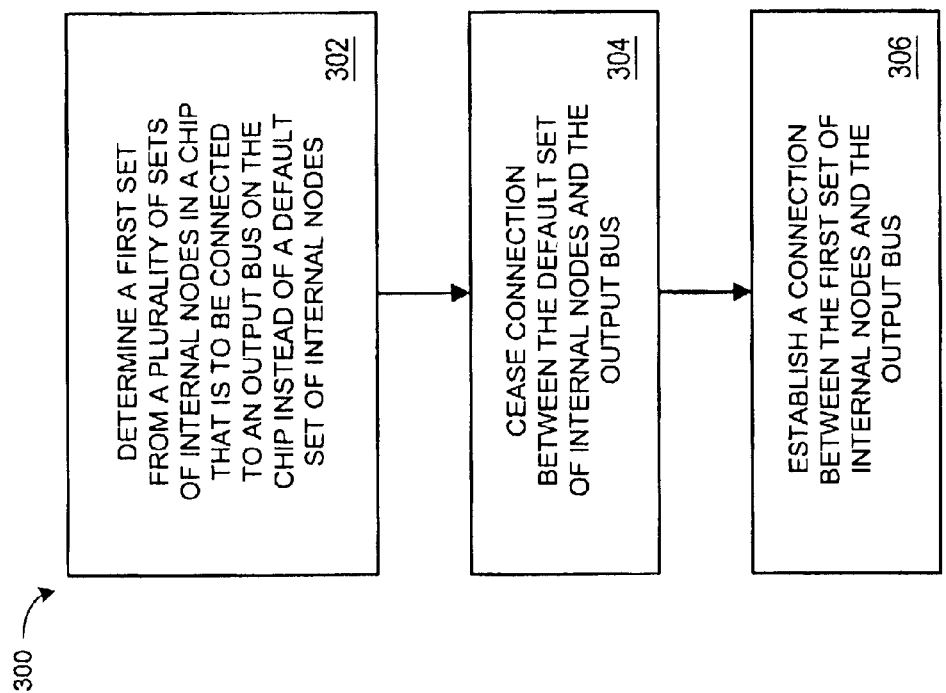
FIG. 4 is a flowchart depicting a first embodiment of a method of determining internal state information for a chip.

Now referring to FIG. 4, a first embodiment 300 of method in accordance with the present invention is illustrated. Processing begins at 302 during which a first set of internal nodes in a chip is determined that is to be connected to an output bus on the chip instead of a default set of internal nodes. At 304, connection between the default set of internal nodes and the output bus is ceased and, at 306, a connection between the first set of internal nodes and the output bus is established. The output bus may be connected to one or more output pins.

Figure 5:
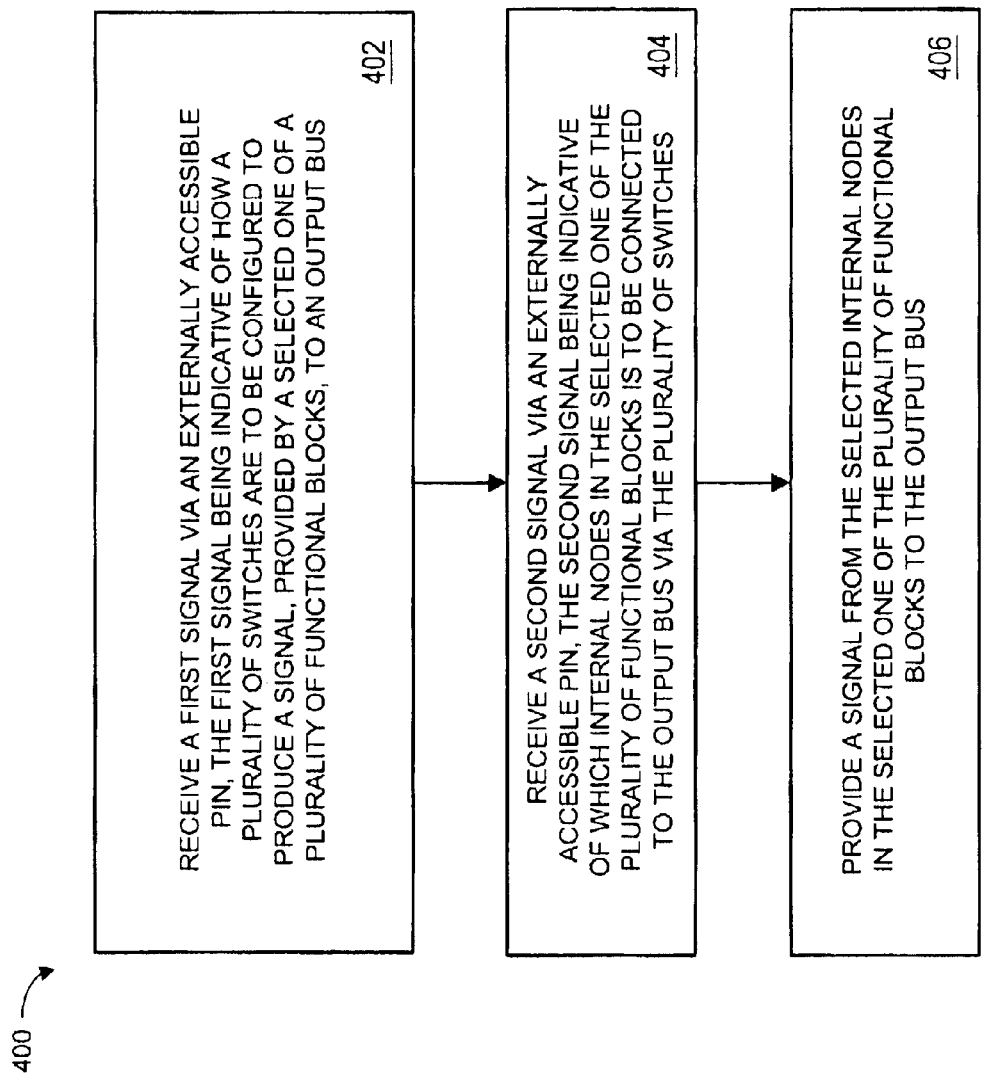
FIG. 5 is a flowchart depicting a second embodiment of a method of determining internal state information for a chip.

Now referring to FIG. 5, a second embodiment 400 of a method in accordance with the present invention is illustrated. Processing begins at 402 during which an apparatus 200 receives an input signal placed on one or more of the externally accessible pins 116, the signal being indicative of how a group of switches (e.g., 106, 120, 122, 124) contained within the apparatus 200 are to be configured to produce a signal to the output bus 118 provided by a selected one of a plurality of functional blocks 102, 126, 128, 130.

During 404, the apparatus 202 receives an input signal on one or more of the externally accessible pins 202, the signal being indicative of which internal nodes in the selected one of the functional blocks 102, 126, 128, 130 is to be connected to the output bus 118 via the group of switches.

During 406, the apparatus 202 provides signals from the selected internal nodes in the selected one of the functional blocks 102, 126, 128, 130 to the output bus 118.

Figure 6:
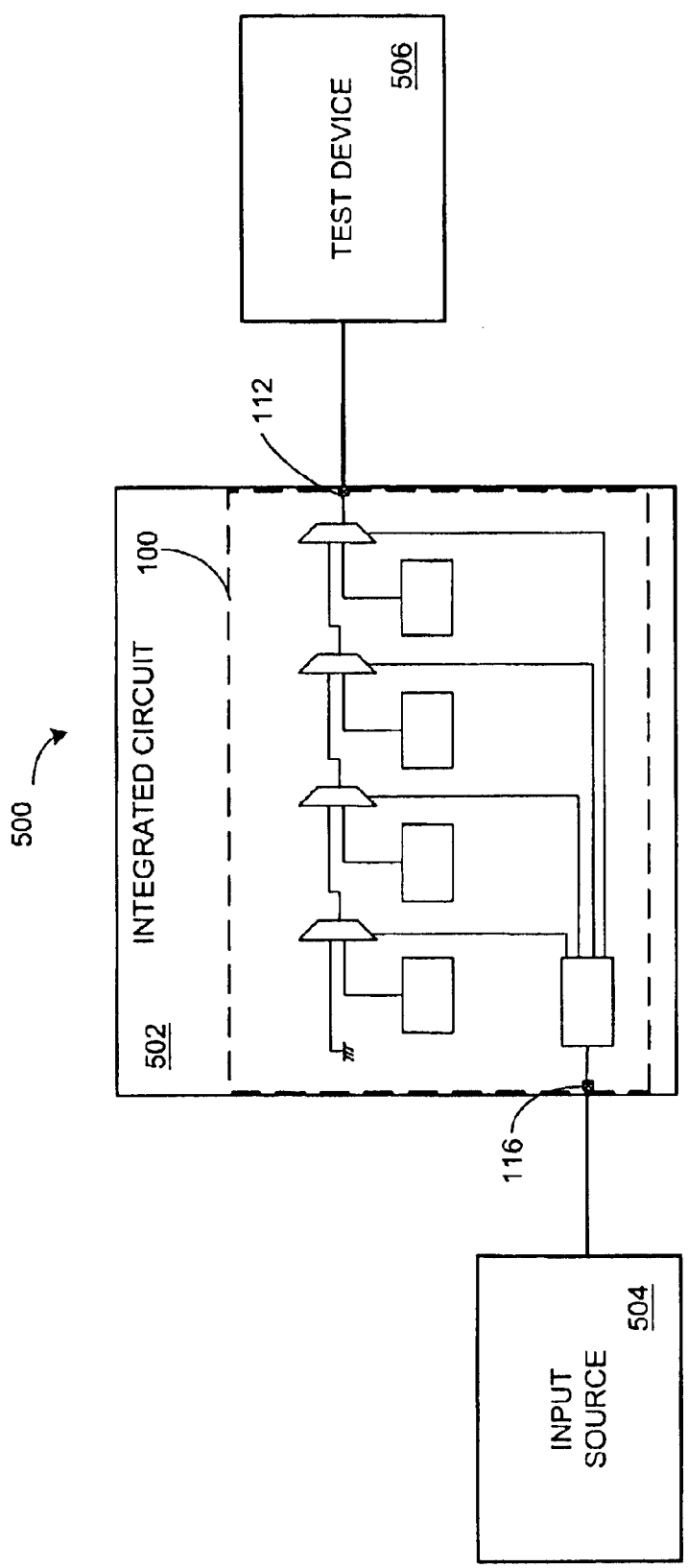
FIG. 6 is a diagram of a system using the apparatus of Figure 1.

Now referring to FIG. 6, a system 500 is illustrated that may use or incorporate the apparatus 100 or the apparatus 200 previously discussed above. For purposes of ease of explanation, but not limitation, only the apparatus 100 is shown in the system 500. However, other embodiments of the system 500 may include the apparatus 200 instead of the apparatus 200.

The system 500 may include an integrated circuit, die, or chip 502 that includes the apparatus 100. The system 500 may include an input source (e.g., voltage or logic signal source) or other device 504 connectable to the chip 502. Thus, the input source or other device 504 is not part of the chip 502 or the apparatus 100. One or more signals or inputs from the input source 504 may be connected to the select pins 116 in the apparatus 100.

The system 500 also may include a test device (e.g., logic analyzer, probe, oscilloscope) 506 connectable to the chip 502. Thus, the test device 506 is not part of the chip 502 or the apparatus 100. One or more signals from the output pins 112 of the apparatus 100 may connected to the test device 506.

While an on chip logic analyzer debug apparatus and method has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. An apparatus, comprising:
   a first switch in a chip, the first switch having an output bus connected to at least one externally accessible pin of the chip, a first input bus and a second input bus;
   a second switch in the chip having an output bus connected to the first input bus of the first switch, a first input bus, and a second input bus; and
   a decoder in the chip, the decoder having an input connected to at least one externally accessible second pin of the chip and the decoder being connected to the first switch and the second switch adapted to control, based on a signal provided on the input, if data on the first input bus of the second switch, data on the second input bus of the second switch, or data on the second input bus of the first switch is provided to the output bus of the first switch.

2. The apparatus of claim 1, further comprising:
   first circuitry in the chip to produce data on the second input bus of the first switch; and
   second circuitry in the chip to produce data on the second input bus of the second switch.

3. The apparatus of claim 2, further comprising:
   at least one externally accessible third pin connected to the first circuitry to control output of the first circuitry on the second input bus of the first switch.

4. The apparatus of claim 3, further comprising:
   at least one externally accessible fourth pin connected to the second circuitry to control output of the second circuitry on the second input bus of the second switch.

5. The apparatus of claim 1, further comprising:
   a third switch in the chip connected to the decoder and having an output bus connected to the first input bus of the second switch, a first input bus, and a second input bus; and
   third circuitry in the chip to produce data on the second input bus of the third switch.

6. The apparatus of claim 1, the data on the second input bus of the first switch representing the default operation of the chip.

7. The apparatus of claim 6, the data on the first input bus of the first switch being indicative of a state internal to the chip.

8. The apparatus of claim 1, the first input bus, the second input bus, and the output bus of the first switch each being N-bits in length.

9. The apparatus of claim 8, the first input bus, the second input bus, and the output bus of the second switch each being N-bits in length.

10. An apparatus, comprising:
    a first switch in a chip having an output bus connected to an externally accessible output pin, a first input bus and a second input bus;
    a second switch in the chip having an output bus connected to the first input bus of the first switch, a first input bus, and a second input bus;
    first circuitry in the chip connected to the second input bus of the first switch to produce first data on the second input bus of the first switch;
    second circuitry in the chip connected to the second input bus of the second switch to produce second data on the second input bus of the second switch;

a bus in the chip connected to the first circuitry and the second circuitry, the bus being adapted to provide a control signal to said first circuitry and said second circuitry; and a decoder in the chip, the decoder having an input connected to at least one externally accessible second pin of the chip and the decoder being connected to the first switch and the second switch and adapted to control, based on a signal provided on the input, if data on the first input bus of the second switch, the first data on the second input bus of the second switch, or the second data on the second input bus of the first switch is provided to the output bus of the first switch.

11. The apparatus of claim 10, further comprising:

a third switch in the chip connected to the decoder and having an output bus connected to the first input bus of the second switch, a first input bus, and a second input bus; and third circuitry in the chip to produce data on the second input bus of the third switch.

12. The apparatus of claim 11, the data on the first input bus of the first switch being indicative of a state internal to the chip.

13. An apparatus, comprising:

a plurality of circuitry blocks in a chip, each circuitry block being connected to an input bus of a different one of a group of switches, one of the switches having an output bus connected to an externally accessible pin; and a decoder in the chip, the decoder having at least one input connected to an externally accessible second pin, and the decoder being connected to each of the group of switches and adapted to control which output produced by at least one of the plurality of circuitry blocks in the chip is provided to the output bus.

14. The apparatus of claim 13, a switch from the group of switches having a first input bus to receive data from a first of the plurality of circuitry blocks and a second input bus to receive data from a second of the plurality of circuitry blocks.

15. The apparatus of claim 13, a first switch from the group of switches having a first input bus to receive data from a first of the plurality of circuitry blocks and a second input bus to receive data from an output bus of a second switch from the group of switches.

16. An apparatus, comprising:

a plurality of switches in a chip, each switch having an input bus connected to a different block of circuitry in the chip and an input bus connected to an output bus of another of the plurality of switches, wherein one of the switches has an output bus connected to at least one pin externally accessible from the chip; and a decoder in the chip, the decoder having at least one input connected to an externally accessible second pin, and the decoder being connected to each of the plurality of switches and adapted to control which output produced by at least one of the plurality of circuitry blocks in the chip is provided to the output bus.

17. The method of claim 16, further comprising:

a bus connected to each of the plurality of circuitry blocks and to at least one externally accessible third pin of the chip.

18. A method, comprising:

receiving a first signal placed from at least one externally accessible pin, the first signal being indicative of how a group of switches are to be configured to produce a signal to an output bus provided by a selected one of a plurality of functional blocks;

receiving a second signal on at least one externally accessible second pin, the second signal being indicative of which selected internal nodes in the selected one of the plurality of functional blocks is to be connected to the output bus via the group of switches; and providing at least one signal from the selected internal nodes in the selected one of the functional blocks to the output bus.

19. The method of claim 18, further comprising:

decoding said first signal to create a third signal, the third signal being indicative of how one of the group of switches should be configured; and providing the third signal to the one of the group of switches.

20. A system comprising:

a chip including an apparatus; and an off-chip test device connectable to the apparatus;

wherein the apparatus includes:

a first switch in the chip, the switch having an output bus connected to at least one externally accessible pin of the chip, a first input bus and a second input bus;

a second switch in the chip having an output bus connected to the first input bus of the first switch, a first input bus, and a second input bus; and a decoder in the chip, the decoder having an input connected to at least one externally accessible second pin of the chip and the decoder being connected to the first switch and the second switch adapted to control, based on a signal provided on the input, if data on the first input bus of the second switch, data on the second input bus of the second switch, or data on the second input bus of the first switch is provided to the output bus of the first switch.

21. The system of claim 20, wherein the apparatus further comprises:

first circuitry in the chip to produce data on the second input bus of the first switch; and second circuitry in the chip to produce data on the second input bus of the second switch.

* * * * *